United States Patent

Higashi et al.

[11] Patent Number: 6,027,791
[45] Date of Patent: Feb. 22, 2000

[54] STRUCTURE FOR MOUNTING A WIRING BOARD

[75] Inventors: Masahiko Higashi; Kouichi Yamaguchi; Masanari Kokubu; Hitoshi Kumatabara; Noriaki Hamada; Kenichi Nagae; Michio Shinozaki; Yasuhide Tami, all of Kagoshima-ken, Japan

[73] Assignee: Kyocera Corporation, Kyoto, Japan

[21] Appl. No.: 08/939,563

[22] Filed: Sep. 29, 1997

[30] Foreign Application Priority Data

| Sep. 30, 1996 | [JP] | Japan | 8-258822 |
| Oct. 30, 1996 | [JP] | Japan | 8-288740 |
| Dec. 27, 1996 | [JP] | Japan | 8-350091 |

[51] Int. Cl.$^7$ .................................................. B32B 9/00
[52] U.S. Cl. ...................... 428/209; 428/210; 257/720; 257/693; 257/780; 257/781
[58] Field of Search .................. 428/210, 209; 257/780, 781, 693, 720

[56] References Cited

U.S. PATENT DOCUMENTS

| 3,486,223 | 12/1969 | Butera | 257/781 |
| 3,488,840 | 1/1970 | Hymes et al. | 257/781 |
| 5,640,052 | 6/1997 | Tsukamoto | 257/781 |
| 5,641,996 | 6/1997 | Omoya et al. | 257/780 |
| 5,672,548 | 9/1997 | Culnane et al. | 257/720 |
| 5,729,894 | 3/1998 | Rostoker et al. | 257/693 |
| 5,736,790 | 4/1998 | Iyogi et al. | 257/780 |
| 5,763,059 | 6/1998 | Yamaguchi et al. | 428/209 |
| 5,777,391 | 7/1998 | Nakamura et al. | 257/780 |
| 5,796,170 | 8/1998 | Marcantonio | 257/693 |
| 5,838,069 | 11/1998 | Itai et al. | 257/781 |
| 5,847,456 | 12/1998 | Shoji | 257/693 |
| 5,872,400 | 2/1999 | Chapman et al. | 257/781 |

*Primary Examiner*—Deborah Jones
*Assistant Examiner*—Cathy F. Lam
*Attorney, Agent, or Firm*—Loeb & Loeb, LLP

[57] ABSTRACT

A structure for mounting a wiring board in which the wiring board including a ceramics insulating board, metallized wiring layers arranged on said insulating board, and a plurality of connection terminals mounted on said insulating board and electrically connected to said metallized wiring layer, is placed on a mother board having wiring conductors formed on the surface of an insulator which contains an organic resin, and the connection terminals of said wiring board are connected by brazing to the wiring conductors of said mother board, wherein a value F1 defined by the following formula (1):

$$F1 = L \times \Delta\alpha / H^2 \qquad (1)$$

wherein L is a distance (mm) between the two connection terminals which are most separated away from each other among a plurality of connection terminals mounted on said insulating board, $\Delta\alpha$ is a difference in the coefficient of thermal expansion (ppm/° C.) between the insulating board of said wiring board and said mother board at 40 to 400° C., and H is a height (mm) of brazing between said wiring board and said mother board.

is not larger than 2000. This structure effectively loosens a difference in the thermal expansion between the wiring board and the mother board, and maintains favorable electric connection between the two for extended periods of time.

15 Claims, 4 Drawing Sheets

STRUCTURE FOR MOUNTING A WIRING BOARD

BACKGROUND OF THE INVENTION

1. Field of the Invention

The present invention relates to a mounting structure adapted to mounting, by brazing, a wiring board and, particularly, a large surface mounting-type wiring board on the surface of a mother board equipped with an insulator which contains an organic resin.

2. Description of the Prior Art

A wiring board, in general, has a structure in which a metallized wiring layer is arranged on the surface of, or in the inside of, an insulating board. A representative example of the wiring board will be a package for accommodating semiconductor elements and, particularly, a package for accommodating semiconductor integrated circuit elements such as LSIs (large-scale integrated circuit elements). In such a package, in general, recessed portions for accommodating semiconductor elements are formed in the surface of the insulating board composed of alumina ceramics, and a plurality of metallized wiring layers composed of a powder of a high-melting metal such as tungsten, molybdenum, etc. are arranged on the surface and inside the insulating board, and are electrically connected to the semiconductor elements accommodated in the recessed portions. On the lower surface or on the side surfaces of the insulating board are further provided connection terminals for electric connection to the mother board, the connection terminals being electrically connected to the metallized wiring layers. That is, the package for accommodating semiconductor elements is mounted upon electrically connecting the connection terminals, by brazing using a solder or the like, to the wiring conductors formed on the surface of the mother board.

Here, the number of electrodes formed on the semiconductor element increases with an increase in the degree of integration of the semiconductor element and, hence, the number of connection terminals provided on the package increases, too. Furthermore, the size of the package must be increased with an increase in the number of the electrodes. To meet the requirement for decreasing the size of the packages, however, it is also necessary to increase the number of the connection terminals per a package (i.e., to increase the density of the connection terminals).

Most generally, the connection terminals of the conventional packages for accommodating semiconductor elements are in the form of a pin grid array (PGA) in which metal pins such as of Kovar are connected to the lower surfaces of the packages. Furthermore, the surface mounting-type packages include a quad flat package (QFP) in which an L-shaped metal member is brazed to the metallized wiring layer drawn onto the side surface of the package, a leadless chip carrier (LCC) having electrode pads on the four side surfaces of the package but without having lead pins, and a ball grid array (BGA) in which spherical terminals composed of a brazing material such as solder are provided on the lower surface of the insulating board. Among them, it has been said that the BGA enables the connection terminals to be formed most highly densely.

In the BGA, the spherical terminals are brazed to the connection pads, and are placed on, and are contacted to, the wiring conductors of the mother board. In this state, the spherical terminals are heated and melted at a temperature of about 250 to 400° C. and are joined to the wiring conductors, so that the BGA is mounted on the mother board. Owing to such a mounting structure, the electrodes of the semiconductor element contained in the package are electrically connected to the mother board via metallized wiring layers and the connection terminals.

The insulating boards used for the packages have heretofore been composed of ceramics such as alumina, mullite, etc. The ceramic insulating board has a strength which is as high as not smaller than 200 MPa and offers such an advantage that the metallized wiring layers can be formed in a multiplicity of layers. When the package is mounted on the surface of the mother board which is a printed board containing an organic resin such as glass-epoxy resin composite material or glass-polyimide resin composite material, however, heat generated during the operation of the semiconductor element is repetitively conducted to both the insulating board and to the mother board, giving rise to the occurrence of thermal stress. This stems from the fact that a difference in the coefficient of thermal expansion is not smaller than 10 ppm/° C. between the ceramic insulating board and the mother board.

The thermal stress is small when the number of terminals provided on the package is relatively as small as 300 or less or when the size of the package is small. When the number of the connection terminals exceed 300 or when the size of the package increases, however, the thermal stress tends to increase. As the thermal stress increases, the thermal stress is repetitively applied to the portion where the package is mounted by soldering on the mother board accompanying the operation/inoperation of the semiconductor element. Therefore, stress is concentrated on the outer peripheral portions of the connection terminals on the package and on the junction interface between the connection terminals and the wiring conductors of the mother board, whereby the connection terminals are peeled off the insulating board in the package or the connection terminals are peeled off the wiring conductors of the mother board. In the conventional structure for mounting the wiring board as will be understood from the above description, when a semiconductor element having a high degree of integration is used, in particular, there exists a fatal defect in that the electric connection between the connection terminals of the package and the wiring conductors of the mother board cannot be stably maintained for extended periods of time. This tendency appears particularly conspicuously in the above-mentioned surface mounting-type packages such as QFP, LCC and BGA.

SUMMARY OF THE INVENTION

The object of the present invention therefore is to provide a structure for mounting a wiring board, which is capable of mounting a wiring board such as package for accommodating semiconductor elements on a mother board having an insulator which contains an organic resin, maintaining stable electric connection for extended periods of time.

Another object of the present invention is to provide a structure for mounting a wiring board, which is effectively adapted to mounting a large wiring board accommodating semiconductor elements at a particularly high degree of integration and having a number of connection terminals, on the mother board.

The present inventors have studied the structure for mounting a wiring board on a mother board, and have discovered the fact that the thermal stress generated in the solder-joined portion is effectively loosened, the electric connection between the wiring board and the mother board is stably maintained for extended periods of time, and the wiring board is stably mounted when a maximum length of the wiring board, the height of brazing in a portion where the insulating board of the wiring board is joined to the mother board, the thickness of the wiring board and the Young's modulus of the wiring board, are so set as to establish a particular relationship with respect to a difference in the coefficient of thermal expansion between the wiring board and the mother board.

According to the present invention, there is provided a structure for mounting a wiring board in which wiring board including a ceramics insulating board, metallized wiring layers arranged on said insulating board, and a plurality of connection terminals mounted on said insulating board and electrically connected to said metallized wiring layer, is placed on a mother board having wiring conductors formed on the surface of an insulator which contains an organic resin, and the connection terminals of said wiring board are connected by brazing to the wiring conductors of said mother board, wherein a value F1 defined by the following formula (1):

$$F1 = L \times \Delta\alpha / H^2 \qquad (1)$$

wherein L is a distance (mm) between the two connection terminals which are most separated away from each other among a plurality of connection terminals mounted on said insulating board, $\Delta\alpha$ is a difference in the coefficient of thermal expansion (ppm/° C.) between the insulating board of said wiring board and said mother board at 40 to 400° C., and H is a height (mm) of brazing between said wiring board and said mother board, is not larger than 2000.

According to the present invention, furthermore, there is provided a structure for mounting a wiring board in which a wiring board including a ceramics insulating board, metallized wiring layers arranged on said insulating board, and a plurality of connection terminals mounted on said insulating board and electrically connected to said metallized wiring layer, is placed on a mother board having wiring conductors formed on the surface of an insulator which contains an organic resin, and the connection terminals of said wiring board are connected by brazing to the wiring conductors of said mother board, wherein a value F2 defined by the following formula (2):

$$F2 = L \times \Delta\alpha \times t - [(0.025 \times L^3 \times \Delta\alpha)/(E \times t^3)] \qquad (2)$$

wherein L is a distance (mm) between the two connection terminals which are most separated away from each other among a plurality of connection terminals mounted on said insulating board, $\Delta\alpha$ is a difference in the coefficient of thermal expansion (ppm/° C.) between the insulating board of said wiring board and said mother board at 40 to 400° C., t is a thickness (mm) of the wiring board, and E is a Young's modulus (GPa) of the wiring board, is not larger than 200.

DETAILED DESCRIPTION OF THE INVENTION

A concrete embodiment of the present invention will now be described in detail with reference to the accompanying drawings.

Figure 1:
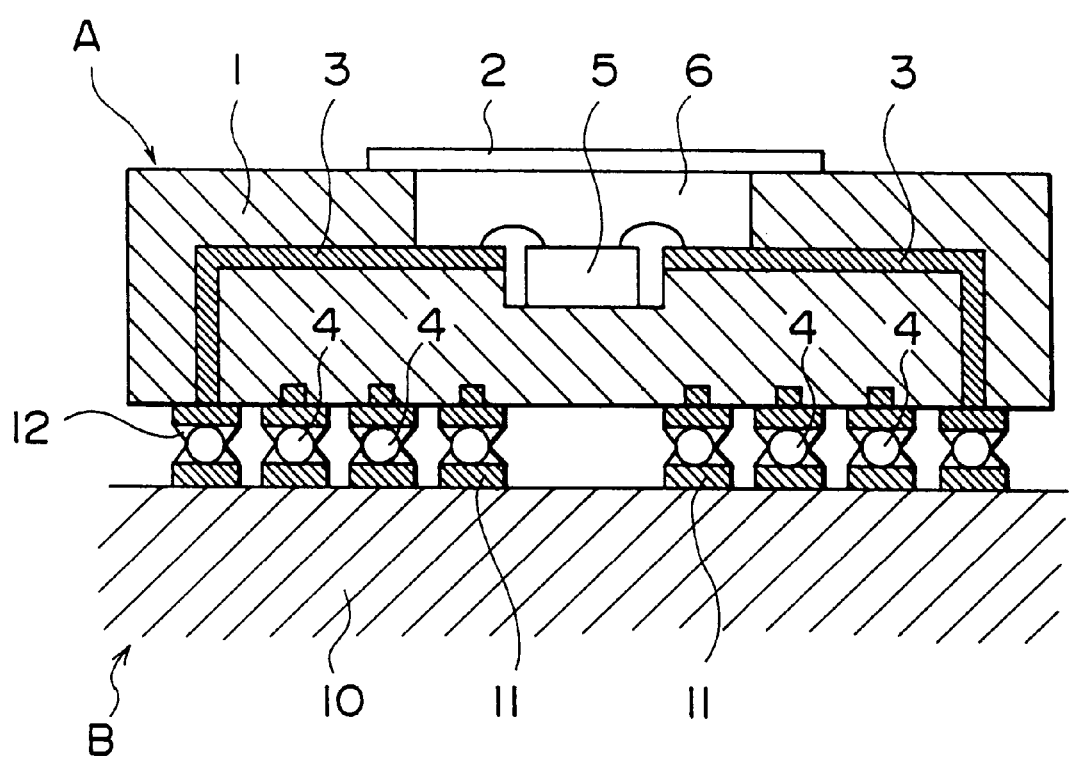
FIG. 1 is a schematic diagram for illustrating a structure for mounting a wiring board according to the present invention.

FIG. 1 illustrates a mounting structure using a BGA-type package as a wiring board, wherein symbol A denotes a BGA-type package and B denotes a mother board.

In FIG. 1, the package A is constituted by a ceramic insulating board 1, a closure 2, metallized wiring layers 3, connection terminals 4, and a semiconductor element 5 accommodated in the package. The semiconductor element 5 is accommodated in a cavity 6 formed in the insulating board 1, the cavity 6 being air-tightly sealed with the closure 2.

The connection terminals 4 are formed on the lower surface of the insulating board 1 and are electrically connected to the metallized wiring layers 3 arranged on the surface of, and inside of, the insulating board 1. In the BGA-type package A, the connection terminals 4 have a structure in which, as shown in, for example, FIGS. 3(a) and 3(b), many electrode pads 7 formed on the lower surface of the insulating board 1 and ball-like terminals 8 composed of a high-melting brazing material such as solder (tin-lead alloy) are joined together with a low-melting solder 9.

On the other hand, the mother board B is a so-called printed board and has wiring conductors 11 composed of a metal or an alloy such as Cu, Au, Al, Ni or Pb-Sn formed on the surface of an insulator 10 of a composite material containing an organic resin such as glass-epoxy resin or glass-polyimide resin. Hereinafter, the mother board is often simply referred to as printed board.

To mount the BGA-type package A on the printed board B, the connection terminals 4 (ball-like terminals 8) of the insulating board 1 of the package A are placed on, and contacted to, the wiring conductors 11 of the printed board B, and are joined to the wiring conductors 11 with a brazing material 12 such as low-melting solder or the like.

Adjusting a Value F1:

In the above-mentioned mounting structure of the present invention, it is important that a value F1 defined by the above-mentioned formula (1), i.e., defined by, $$F1 = L \times \Delta\alpha / H^2 \qquad (1)$$

is set to be not larger than 2000, preferably, not larger than 1000 and, most preferably, not larger than 500.

That is, upon setting the value F1 to lie within the above-mentioned range, the thermal stress built up in the junction portion between the package A and the printed board B is effectively loosened. Even when, for example, the semiconductor element 5 is repetitively operated and stopped, therefore, the connection terminals 4 are not peeled off and the circuit is prevented from being broken, and a stable electric connection is maintained for extended periods of time.

Figure 2:
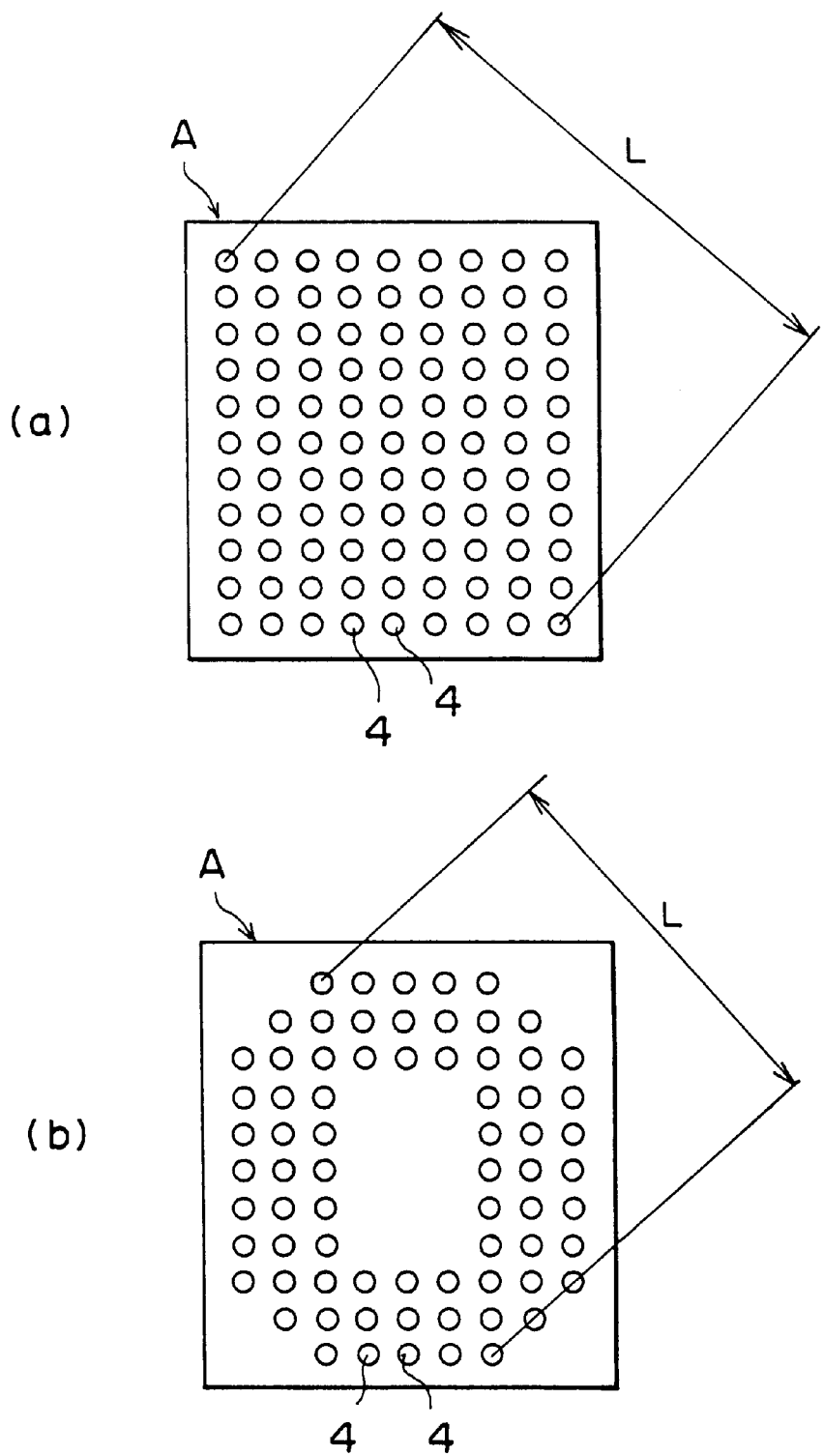
FIG. 2 is a diagram illustrating the shapes of the lower surface of a package shown in FIG. 1.

In the above-mentioned formula (1), symbol L denotes a distance (mm) between the two connection terminals which are most separated away from each other among a plurality of connection terminals mounted on the insulating board, i.e., denotes a maximum distance between the two connection terminals. When the groups of connection terminals 4 are arranged in a square shape as shown in, for example, FIG. 2(a), the distance L corresponds to the length of a diagonal line of the square. When the groups of connection terminals 4 are arranged in a complex shape as shown in FIG. 2(b), the distance L corresponds to a distance between the two connection terminals which are most separated away from each other. As will be understood from the above embodiment, the distance L in the formula (1) is an index representing a maximum length of the package A, i.e., of the wiring board mounted on the printed board B.

Furthermore, H in the formula (1) denotes a height (mm) of brazing between the package A and the printed board B. In the case of the mounting structure shown in, for example, FIG. 3(a), the distance from the surface of the wiring conductor 11 of the printed board B to the surface of the electrode pad 7 of the package A is a height H of brazing. In the mounting structure shown in FIG. 3(b), a recessed portion 13 is formed in the lower surface of the package A, an electrode pad 7 is formed in the recessed portion 13, and a ball-like terminal 8 enters into the recessed portion 13. In this case, therefore, the distance from the surface of the wiring conductor 11 of the printed board B to the bottom surface of the insulating board A in the package A is a height H of brazing.

In the formula (1), furthermore, $\Delta\alpha$ denotes a difference in the coefficient of thermal expansion (ppm/° C.) between the insulating board in the wiring board and the mother board at 40 to 400° C.

The stress generated between the insulating board 1 in the package A and the printed board B increases with an increase in the index L representing a maximum length of the package A (wiring board) and with an increase in the difference in the coefficient of thermal expansion $\Delta\alpha$ between them. This is because, as the index L and the difference $\Delta\alpha$ increase, the difference in the thermal expansion or in the contraction between the insulating board 1 and the printed board B increases depending upon a change in the temperature.

According to the present invention, the stress that generates between the insulating board 1 and the printed board B is loosened by so adjusting the height H of brazing that the value F1 defined by the formula (1) lies within the above-mentioned range depending upon the values L and $\Delta\alpha$. When the values L and $\Delta\alpha$ are large to some extent, the height H of brazing is so increased that the value F1 lies within the above-mentioned range, whereby the stress is loosened and the mounting structure exhibits enhanced reliability. When the height H of brazing is small and, hence, the value F1 is larger than the above-mentioned range, an increased stress acts upon the brazed portion and it becomes difficult to avoid the deterioration of electric connection with the passage of time.

The mounting structure based upon the adjustment of the value F1 is effective when the device is very greatly affected by the stress which is caused by a difference in the thermal expansion between the insulating board 1 and the printed board B. This mounting structure is very desirable when the wiring board having a maximum distance L between the connection terminals of not smaller than 6 mm, particularly, not smaller than 10 mm, and, more particularly, not smaller than 12 mm, is to be mounted on a printed board having a coefficient of thermal expansion of from 8 to 28 ppm/° C. at 40 to 400° C.

It is further desired that the insulating board 1 has a coefficient of thermal expansion of from 8 to 25 ppm/° C. at 40 to 400° C. and a difference $\Delta\alpha$ in the coefficient of thermal expansion from the printed board B of from 0 to 5 ppm/° C. (absolute value). That is, when the difference in the coefficient of thermal expansion is large, the stress that is generated is seriously affected by the height H of brazing, and it becomes necessary to precisely adjust the height H of brazing. With the difference in the coefficient of thermal expansion being set at a small value as described above, however, the allowable range of the height H of brazing increases for the value F1 that is adjusted to lie within the above-mentioned range. It is further desired that the height H of brazing is from 0.1 to 1.2 mm. Outside this range, defects tend to occur during the mounting, such as breakage in the line, short-circuit between the soldered portions, etc. in the braced portions.

Adjusting a Value F2:

According to the present invention, highly reliable mounting is accomplished by setting a value F2 defined by the formula (2), i.e., defined by, $$F2 = L \times \Delta\alpha \times t - [(0.025 \times L^3 \times \Delta\alpha)/(E \times t^3)] \qquad (2)$$

to be not larger than 200 and, preferably, not larger than 150 instead of adjusting the value F1 defined by the above-mentioned formula (1).

Figure 4:
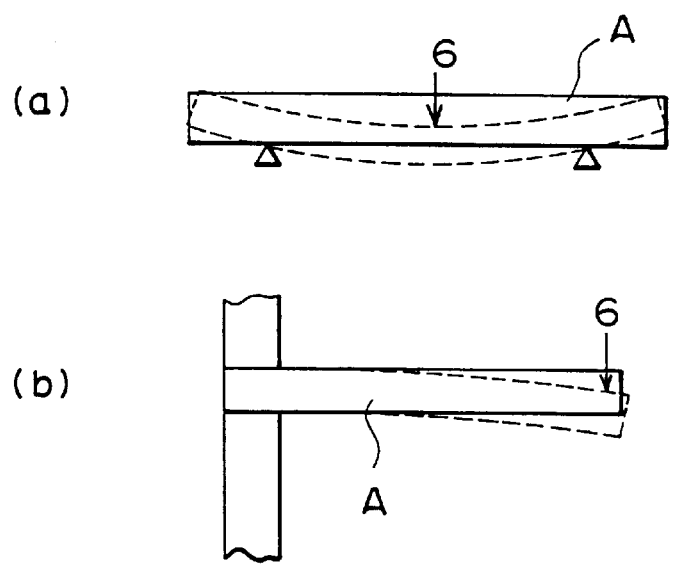
FIG. 4 is a diagram illustrating the methods of measuring the Young's modulus of the wiring board.

In the formula (2), L and $\Delta\alpha$ are indexes which are quite the same as those shown in the formula (1), and t is a thickness (mm) of the wiring board A which substantially corresponds to the thickness of the insulating board 1. Symbol E is a Young's modulus (GPa) of the wiring board A and is calculated in compliance with JIS-R-1602. That is, as shown in FIG. 4(a), the wiring board A having metallized wiring layers formed on the surface and/or in the inside of the insulating board 1, is supported at two points, and the Young's modulus E is calculated from the amount of deflection of the wiring board A of when a load ($\sigma$) is applied thereto. As shown in FIG. 4(b), furthermore, one end of the wiring board A is fixed, and the Young's modulus E is calculated from the amount of deflection of the wiring board A of when the load ($\sigma$) is applied to the other end thereof.

When the wiring board A is mounted on the printed board B, or when the semiconductor element is repetitively operated after the mounting, stress occurs due to a difference in the thermal expansion between the wiring board A and the printed board B. This stress is the sum of a compressive stress toward the center of the wiring board A and a bending stress acting on the wiring board A downwardly in the vertical direction. The stress caused by the difference in the thermal expansion, increases with an increase in the maximum distance L between the connection terminals of the wiring board A, in the difference $\Delta\alpha$ of the thermal expansion between the wiring board A and the printed board B, and in the thickness t of the wiring board A.

The compressive stress is loosened as the wiring board A is distorted, and the bending stress is loosened as the wiring board A is deflected. The amount of distortion and the amount of deflection of the wiring board A vary depending upon the size and the Young's modulus E of the wiring board A. For example, the smaller the Young's modulus E, the easier the wiring board A is distorted and is deflected, making it possible to loosen the compressive stress and the bending stress. Therefore, setting the value F2 defined by the formula (2) to be smaller than 200 and, particularly, smaller than 150, is effective in loosening the compressive stress and the bending stress.

In the formula (2), for example, the term (L×$\Delta\alpha$×t) represents the magnitude of stress that occurs due to a difference in the thermal expansion between the wiring board A and the printed board B of when the wiring board A is mounted on the printed board B or when the semiconductor element is repetitively operated after the mounting. Furthermore, the term $(0.025 \times L^3 \times \Delta\alpha)/(E \times t^3)$ represents the magnitude of stress that is loosened as the wiring board A is deflected. Therefore, the stress due to the difference in the thermal expansion is loosened as the value F2 decreases. When this value F2 is larger than the above-mentioned range, the compressive stress and the bending stress acting on the brazed portion between the wiring board A and the printed board B are not effectively loosened, and the electric connection between the two is inevitably deteriorated with the lapse of time.

Upon so setting the parameters L, $\Delta\alpha$, t and E that the value F2 does not become greater than a predetermined value, therefore, a highly reliable mounting is accomplished even when the wiring board A is large, a maximum distance L between the connection terminals is great, and the thickness t is large.

The mounting structure based on the adjustment of the value F2 is effective when the device is subject to be very greatly affected by the stress that is caused by a difference in the thermal expansion between the insulating board 1 and the printed board B. In particular, this mounting structure is advantageous for mounting the wiring board A having a thickness t of not smaller than 0.3 mm, and in which a maximum distance L between the connection terminals is not smaller than 6 mm, particularly, not smaller than 20 mm, more preferably, not smaller than 30 mm and, most desirably, not smaller than 40 mm. In this case, it is desired that the printed board B has a coefficient of thermal expansion of from 8 to 28 ppm/° C. at 40 to 400° C.

It is further desired that the insulating board 1 has a coefficient of thermal expansion of from 8 to 25 ppm/° C. at 40 to 400° C., and that the wiring board A has a Young's modulus E of not larger than 200 GPa, and a difference $\Delta\alpha$ in the coefficient of thermal expansion between the insulating board A and the printed board B of from 0 to 5 ppm/° C. (absolute value).

Material Constituting the Wiring Board and Method of Preparation:

In the present invention, there can be used any ceramic insulating board 1 in the wiring board provided the value F1 or the value F2 lies within the above-mentioned ranges. The ceramic insulating board 1 may be constituted by using any widely known insulating material such as ceramics, glass or glass ceramics composed chiefly of $Al_2O_3$, AlN, $ZrO_2$, mullite, $Si_3N_4$, or SiC. When the metallized wiring layers arranged on the surface and inside of the insulating board 1 are constituted by at least one of gold, silver or copper, it is desired that the insulating material that constitutes the insulating board is composed of a glass or a glass ceramic that can be fired at a temperature of not higher than 1000° C. from such a standpoint that the metallized wiring layers can be formed by firing simultaneously with the firing of the insulating board. As the glass or glass ceramic, there can be exemplified a boron silicate glass, soda-lime glass or glass ceramics obtained by blending these glasses with $Al_2O_3$, $ZrO_2$, MgO, CaO and AlN as filler components.

As a glass ceramic material that is favorably used in the present invention for forming the insulating board 1 having a coefficient of thermal expansion of from 8 to 25 ppm/° C. at 40 to 400° C., furthermore, there can be preferably used, for example, a sintered product of glass ceramic obtained by firing a mixture of 20 to 80% by volume of a crystalline lithium silicate glass containing 5 to 30% by weight of $Li_2O_3$ and 80 to 20% by volume of a filler component and, particularly, a filler component containing at least one of forsterite, cristobalite and quartz. Use of the crystalline lithium silicate glass in the above-mentioned amount makes it possible to carry out the firing at a temperature of not higher than 1000° C. Besides, the obtained sintered product of the glass ceramic exhibits a Young's modulus of not higher than 200 GPa and a coefficient of thermal expansion of not smaller than 8 ppm/° C.

The crystalline lithium silicate glass preferably contains $Li_2O$ in an amount of from 5 to 30% by weight and $SiO_2$ in an amount of from 60 to 85% by weight, the total amount of $Li_2O$ and $SiO_2$ being from 65 to 95% by weight, and the remainder being $Al_2O_3$, alkaline earth oxide, alkali metal oxide, ZnO, $P_2O_5$, etc. It is further desired that the crystalline lithium silicate glass has a softening point of from 420 to 460° C. and has an yield point of 400 to 800° C. and, particularly, 400 to 650° C. from the standpoint of efficiently removing the organic binder used for the molding and to enhance the sintering property simultaneously with the sintering of copper or the like.

Most desirably, the filler component to be mixed into the crystalline lithium silicate glass contains at least forsterite ($2MgO \cdot SiO_2$) and quarts ($SiO_2$) from the standpoint of adjusting the coefficient of thermal expansion to lie within the above-mentioned range.

In order to adjust the Young's modulus and the coefficient of thermal expansion, it is also allowable to use other filler components such as cristobalite ($SiO_2$), tridymite ($SiO_2$), spinel ($MgO \cdot Al_2O_3$), wollastonite ($CaO \cdot SiO_2$), montecellite ($CaO \cdot MgO \cdot SiO_2$), nepheline ($Na_2O \cdot Al_2O_3 \cdot SiO_2$), lithium silicate ($Li_2O \cdot SiO_2$), diopside ($CaO \cdot MgO \cdot 2SiO_2$), Merwinite ($3CaO \cdot MgO \cdot 2SiO_2$), akermanite ($2CaO \cdot MgO \cdot 2SiO_2$), magnesia (MgO), alumina ($Al_2O_3$), carnegieite ($Na_2O \cdot Al_2O_3 \cdot 2SiO_2$), enstatite ($MgO \cdot SiO_2$), magnesium borate ($2MgO \cdot B_2O_3$), celsian ($BaO \cdot Al_2O_3 \cdot 2SiO_2$), $B_2O_3 \cdot 2MgO \cdot 2SiO_2$, gahnite ($ZnO \cdot Al_2O_3$), and petalite ($LiAlSi_4O_{10}$).

The insulating board is easily prepared by using a mixture of the crystalline lithium silicate glass and a filler; i.e., an organic resin binder for molding is added to the mixture which is then formed into a sheet by the doctor blade method, rolling method or metal-mold press method, followed by firing. In general, the metallized wiring layers are prepared at the same time as preparing the insulating board to obtain the wiring board. That is, a metallizing paste such as of copper, gold or silver is printed on the surface of a green sheet (of before being fired) by the screen-printing method or the like method. Depending upon the cases, through-holes are formed in the green sheet by punching etc. and are filled with the metallizing paste. Then, the obtained plural pieces of green sheets are laminated one upon the other and are fired to obtain a wiring board.

Prior to the firing, the organic resin binder for molding is removed usually in the open air being heated at about 700° C. When copper is used as the wiring conductor (metallizing paste), it is desired that the binder is removed in a nitrogen atmosphere containing water vapor heated at 100 to 700° C. To effectively remove the binder, furthermore, it is desired that the molded article (green sheet) has a contracting start temperature of from about 700 to about 850° C. For this purpose, it becomes necessary to so adjust the properties of the crystalline lithium silicate glass that the yield point lies within the above-mentioned range.

The firing is effected in an oxidizing atmosphere of from 850 to 1050° C., to thereby obtain a sintered product having a relative density of not smaller than 90%. When the firing temperature is lower than the above-mentioned range, it becomes difficult to increase the density. When the firing temperature exceeds 1050° C., on the other hand, the metallized wiring layers melt.

The thus obtained sintered product of glass ceramic constituting the insulating board in the wiring board contains a crystalline phase such as of forsterite or quartz used as a filler, crystalline phase such as of enstatite based upon the filler components, and lithium silicate crystalline phase precipitated from the crystalline glass. There may further exist a crystalline phase formed from the reaction of a crystalline glass with a filler. Trace amounts of a glass phase may often exist on the grain boundaries of the crystalline phases. A sintered product of glass ceramic having a high coefficient of thermal expansion is obtained upon precipitating these crystalline phases, and the coefficient of thermal expansion of the insulating board is set to lie within the above-mentioned range.

Figure 5:
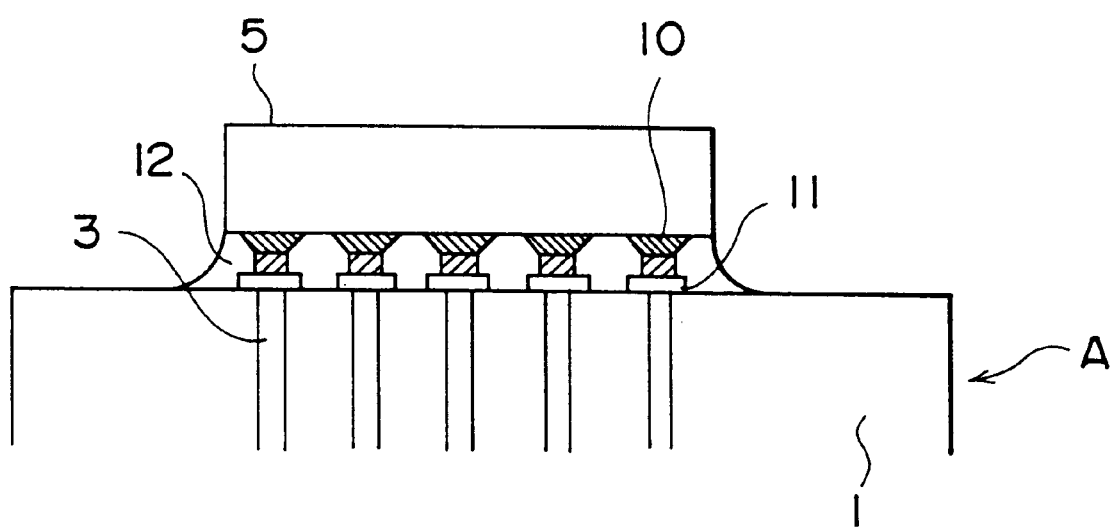
FIG. 5 is a diagram illustrating a preferred example of the structure for mounting a semiconductor element on the wiring board of FIG. 1.

Mounting the Semiconductor Element:

In the present invention, the semiconductor element 5 can be mounted on the above-mentioned wiring board A by various means that have been widely known. In order to enhance the reliability of connection between the semiconductor element 5 and the wiring board A as shown, for example, in FIG. 5, however, it is desired that the electrodes (solder bumps) 10 for connecting the semiconductor element 5 are placed on the land portions 11 of the metallized wiring layers 3 of the wiring board A, heated at a temperature of about 250 to 400° C. to melt and braze the solder bumps 10, and a filler 12 containing a thermosetting resin is poured into between the semiconductor element 5 and the wiring board A and is cured.

That is, the filler 12 reinforces the brazed portions between the semiconductor element 5 and the wiring board A, and effectively prevents the breakage of wires caused by the thermal stress that occurs when the semiconductor element 5 is operated and stopped repetitively.

In this embodiment, it is desired that the filler 12 after thermally cured has a coefficient of thermal expansion of from 20 to 50 ppm/° C. at 40 to 400° C. and has a Young's modulus of from 5 to 10 GPa over the same temperature range. Upon reinforcing the brazed portions with the filler 12 having such properties, the thermal stress that occurs in these portions is effectively lowered and is loosened. When the filler 12 has a coefficient of thermal expansion which is smaller than 20 ppm/° C., thermal expansion and thermal contraction of the filler 12 become to be small, whereby the brazed portions are compressed by the filler 12. In other words, it is not possible to decrease the concentrations of stress at the brazed portions. When the coefficient of thermal expansion is larger than 50 ppm/° C., on the other hand, the filler 12 thermally expands and contracts to a large extent, making it difficult to decrease the concentration of stress at the brazed portions, either. Furthermore, the filler 12 having a Young's modulus which is smaller than 5 GPa tends to be greatly deformed by stress, and the brazed portions are not reinforced to a sufficient degree. On the other hand, the filler 12 having a Young's modulus of larger than 10 GPa is deformed little by stress, is not capable of absorbing distortion caused by a difference in the thermal expansion between the semiconductor element 5 and the wiring board A, and is not capable of effectively loosening the stress at the brazed portions.

The above filler 12 is obtained by mixing a thermosetting resin and an inorganic powder to adjust the coefficient of thermal expansion and the Young's modulus to lie over the above-mentioned ranges. As the thermosetting resin, there can be used a phenol resin, urea resin, melamine resin, epoxy resin, unsaturated polyester resin, diallyl phthalate resin, polyimide resin, silicone resin or polyurethane resin. Among them, there can be preferably used the epoxy resin and, particularly, a bisphenol epoxy resin, phenol novolak epoxy resin, cresol novolak epoxy resin, brominated epoxy resin, and alicyclic epoxy resin. Most desirably, there can be used the phenol novolak epoxy resin and cresol novolak epoxy resin. As the inorganic powder, there can be used quartz glass, alumina, mica, zirconium silicate and lithium silicate, which are usually used in an amount of from 50 to 300 parts by weight per 100 parts by weight of the thermosetting resin. The filler 12 is thermally cured, usually, at a temperature of from about 100 to about 200° C.

In the structure for mounting the semiconductor element 5, it is desired that the insulating board A forming the wiring board A has a Young's modulus of not larger than 200 GPa at 40 to 400° C. and has a coefficient of thermal expansion of from 8 to 25 ppm/° C. over the same temperature range, in order that the filler 12 effectively exhibits reinforcing effect and effectively loosens the stress.

EXAMPLES (Example 1)

A variety of ceramic materials shown in Tables 1 and 2 were fixed under the firing conditions shown in Tables 1 and 2 to prepare sintered products (insulating boards) of a size of 5×4×40 mm. The sintered products were measured for their coefficients of thermal expansion at 40 to 400° C. to be as shown in Tables 1 and 2.

Figure 3:
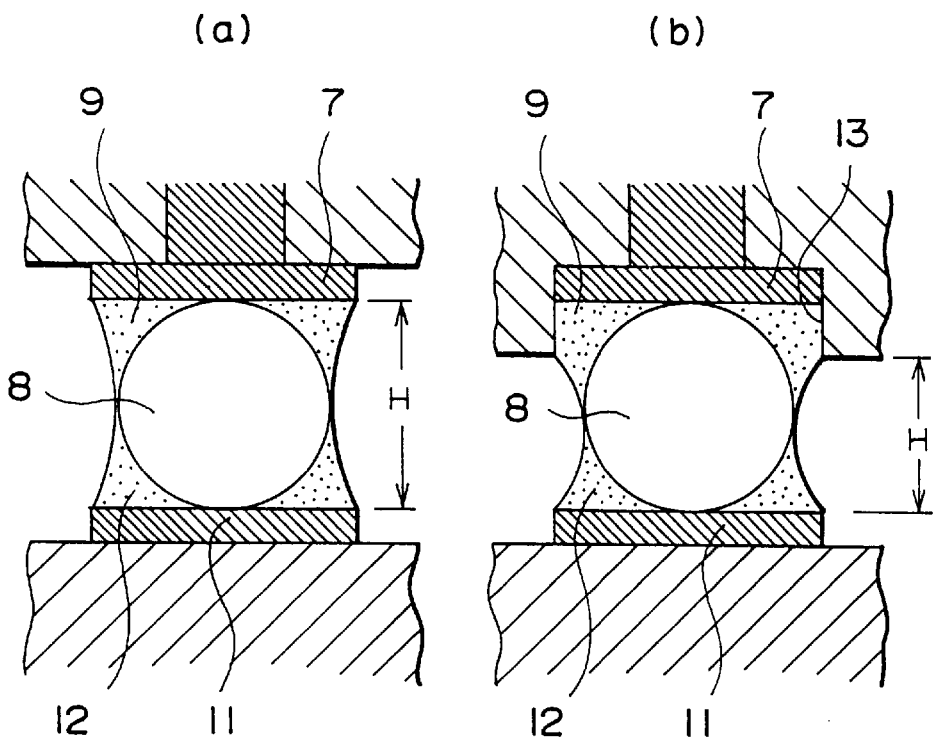
FIG. 3 is a diagram illustrating connection terminals mounted on the package shown in FIG. 1.

Pastes containing metals shown in Tables 1 and 2 were applied onto sheets composed of the above-mentioned various ceramic materials, through-holes were formed therein, connection pads of Cu or W were formed on the lower surfaces of the sheets at portions connected to the through-holes, followed by firing under the conditions shown in Tables 1 and 2 to prepare wiring boards. Nickel was plated on the connection pads, and ball-like connection terminals of a high-melting solder (90% by weight of Pb and 10% by weight of Sn) were attached to the electrode pads by low-melting solder (40% by weight of Pb and 60% by weight of Sn). The connection terminals were formed on the whole lower surface at a density of 30 terminals per a square centimeter as shown in FIG. 3(a). Furthermore, there were prepared a wiring board having 116 terminals with a maximum distance L of 16 mm between the connection terminals and a wiring board having 732 terminals with a maximum distance L of 71 mm between the connection terminals. The wiring boards all possessed a thickness of 1.6 mm.

As a mother board, furthermore, a printed board was prepared by forming wiring conductors of a copper foil on the surface of a glass-epoxy board having a coefficient of thermal expansion of 13 ppm/° C. at 40 to 400° C. having wiring conductors of a copper foil formed on the surface thereof.

The wiring board was so positioned that the connection terminals of the wiring board were connected to the wiring conductors on the printed board, and was mounted on the surface of the printed board by using the low-melting solder. The height H of brazing was adjusted by changing the height of the ball-like terminals mounted by soldering on the electrode pads and by changing the diameter of the balls composed of the high-melting solder.

Heat Cycle Testing:

The structures in which the wiring board was mounted on the surface of the printed board as described above, were held in a constant-temperature vessel maintained at −40° C. and, then, in a constant-temperature vessel maintained at 125° C. in the open atmosphere for 15 minutes/15 minutes as one cycle. This was repeated a maximum of 1000 cycles.

The electric resistance between the wiring conductors of the printed board and the wiring board was measured after each cycle. Tables 1 and 2 show the numbers of cycles until a change appears in the electric resistance that was measured.

TABLE 1

| Sample No. | Insulating board Material (% by vol.) | Firing condition temp. (° C.) | Firing condition atmosphere | Metalized wiring layer | Coefficient of thermal expansion (ppm/° C.) | Difference in thermal expansion Δα (ppm/° C.) | Max. distance L (mm) | Height H of soldering (mm) | F1 value | Result of heat cycle testing (times) |
|---|---|---|---|---|---|---|---|---|---|---|
| *1 | 70 boron silicate glass - 30Al$_2$O$_3$ | 950 | N$_2$ | Cu | 6.0 | 7.0 | 16 | 0.10 | 11200 | 150 |
| *2 | 70 boron silicate glass - 30Al$_2$O$_3$ | 950 | N$_2$ | Cu | 6.0 | 7.0 | 16 | 0.20 | 2800 | 900 |
| 3 | 70 boron silicate glass - 30Al$_2$O$_3$ | 950 | N$_2$ | Cu | 6.0 | 7.0 | 16 | 0.40 | 700 | >1000 |
| 4 | 70 boron silicate glass - 30Al$_2$O$_3$ | 950 | N$_2$ | Cu | 6.0 | 7.0 | 16 | 0.60 | 311 | >1000 |
| *5 | 70 boron silicate glass - 30Al$_2$O$_3$ | 950 | N$_2$ | Cu | 6.0 | 7.0 | 71 | 0.40 | 3106 | 850 |
| 6 | 70 boron silicate glass - 30Al$_2$O$_3$ | 950 | N$_2$ | Cu | 6.0 | 7.0 | 71 | 0.60 | 1380 | >1000 |
| 7 | 70 boron silicate glass - 30Al$_2$O$_3$ | 950 | N$_2$ | Cu | 6.0 | 7.0 | 71 | 0.80 | 777 | >1000 |
| 8 | 70 boron silicate glass - 30Al$_2$O$_3$ | 950 | N$_2$ | Cu | 6.0 | 7.0 | 71 | 1.00 | 497 | >1000 |
| 9 | 70 boron silicate glass - 30Al$_2$O$_3$ | 950 | N$_2$ | Cu | 6.0 | 7.0 | 71 | 1.20 | 345 | >1000 |
| *10 | 100 boron silicate glass | 800 | N$_2$ | Cu | 3.2 | 9.8 | 16 | 0.10 | 15680 | 50 |
| 11 | 100 boron silicate glass | 800 | N$_2$ | Cu | 3.2 | 9.8 | 16 | 0.60 | 436 | >1000 |
| *12 | 100 boron silicate glass | 800 | N$_2$ | Cu | 3.2 | 9.8 | 71 | 0.40 | 4349 | 750 |
| 13 | 100 boron silicate glass | 800 | N$_2$ | Cu | 3.2 | 9.8 | 71 | 0.60 | 1932 | >1000 |
| 14 | 100 boron silicate glass | 800 | N$_2$ | Cu | 3.2 | 9.8 | 71 | 0.80 | 1087 | >1000 |
| 15 | 100 boron silicate glass | 800 | N$_2$ | Cu | 3.2 | 9.8 | 71 | 1.20 | 483 | >1000 |
| *16 | 95ZrO$_2$—5CaO | 1500 | H$_2$ + N$_2$ | W | 10.0 | 3.0 | 16 | 0.10 | 4800 | 700 |
| 17 | " | 1500 | H$_2$ + N$_2$ | W | 10.0 | 3.0 | 16 | 0.60 | 133 | >1000 |
| 18 | " | 1500 | H$_2$ + N$_2$ | W | 10.0 | 3.0 | 71 | 0.40 | 1331 | >1000 |
| 19 | " | 1500 | H$_2$ + N$_2$ | W | 10.0 | 3.0 | 71 | 1.20 | 148 | >1000 |
| *20 | 96Al$_2$O$_3$—4SiO$_2$, MgO | 1600 | H$_2$ + N$_2$ | W | 6.7 | 6.3 | 16 | 0.10 | 10080 | 200 |
| 21 | " | 1600 | H$_2$ + N$_2$ | W | 6.7 | 6.3 | 16 | 0.60 | 280 | >1000 |
| *22 | " | 1600 | H$_2$ + N$_2$ | W | 6.7 | 6.3 | 71 | 0.40 | 2796 | 900 |
| 23 | " | 1600 | H$_2$ + N$_2$ | W | 6.7 | 6.3 | 71 | 1.20 | 311 | >1000 |
| *24 | 95AlN—5Y$_2$O$_3$ | 1800 | H$_2$ + N$_2$ | W | 4.3 | 8.7 | 16 | 0.10 | 13920 | 100 |
| 25 | " | 1800 | H$_2$ + N$_2$ | W | 4.3 | 8.7 | 16 | 0.60 | 387 | >1000 |
| 26 | " | 1800 | H$_2$ + N$_2$ | W | 4.3 | 8.7 | 16 | 0.80 | 217 | >1000 |
| *27 | " | 1800 | H$_2$ + N$_2$ | W | 4.3 | 8.7 | 71 | 0.40 | 3861 | 800 |
| 28 | " | 1800 | H$_2$ + N$_2$ | W | 4.3 | 8.7 | 71 | 0.80 | 965 | >1000 |
| 29 | " | 1800 | H$_2$ + N$_2$ | W | 4.3 | 8.7 | 71 | 1.00 | 618 | >1000 |
| 30 | " | 1800 | H$_2$ + N$_2$ | W | 4.3 | 8.7 | 71 | 1.20 | 429 | >1000 |
| *31 | 95SiC—5B | 1900 | H$_2$ + N$_2$ | W | 5.5 | 7.5 | 16 | 0.10 | 12000 | 150 |
| 32 | " | 1900 | H$_2$ + N$_2$ | W | 5.5 | 7.5 | 16 | 0.60 | 333 | >1000 |
| 33 | " | 1900 | H$_2$ + N$_2$ | W | 5.5 | 7.5 | 71 | 0.40 | 3326 | 850 |
| 34 | " | 1900 | H$_2$ + N$_2$ | W | 5.5 | 7.5 | 71 | 1.20 | 370 | >1000 |
| *35 | 100 mullite | 1600 | H$_2$ + N$_2$ | W | 5.7 | 7.3 | 16 | 0.10 | 11680 | 200 |
| 36 | " | 1600 | H$_2$ + N$_2$ | W | 5.7 | 7.3 | 16 | 0.60 | 324 | >1000 |
| *37 | " | 1600 | H$_2$ + N$_2$ | W | 5.7 | 7.3 | 71 | 0.40 | 3239 | 850 |
| 38 | " | 1600 | H$_2$ + N$_2$ | W | 5.7 | 7.3 | 71 | 1.20 | 360 | >1000 |

Samples marked with * lie outside the scope of the invention.

TABLE 2

| Sample No. | Insulating board Material (% by vol.) | Firing condition temp. (° C.) | Firing condition atmosphere | Metalized wiring layer | Coefficient of thermal expansion (ppm/° C.) | Difference in thermal expansoin Δα (ppm/° C.) | Max. distance L (mm) | Height H of soldering (mm) | F1 value | Result of heat cycle testing (times) |
|---|---|---|---|---|---|---|---|---|---|---|
| *39 | 95Si$_3$N$_4$—5Y$_2$O$_3$ | 1800 | H$_2$ + N$_2$ | W | 3.0 | 10.0 | 16 | 0.10 | 16000 | 50 |
| 40 | " | 1800 | H$_2$ + N$_2$ | W | 3.0 | 10.0 | 16 | 0.60 | 444 | >1000 |
| *41 | " | 1800 | H$_2$ + N$_2$ | W | 3.0 | 10.0 | 71 | 0.40 | 4438 | 750 |
| 42 | " | 1800 | H$_2$ + N$_2$ | W | 3.0 | 10.0 | 71 | 1.20 | 493 | >1000 |
| *43 | 100 soda-lime glass | 900 | N$_2$ | Cu | 9.4 | 3.6 | 16 | 0.10 | 5760 | 600 |
| 44 | " | 900 | N$_2$ | Cu | 9.4 | 3.6 | 16 | 0.60 | 160 | >1000 |
| 45 | " | 900 | N$_2$ | Cu | 9.4 | 3.6 | 71 | 0.40 | 1598 | >1000 |
| 46 | " | 900 | N$_2$ | Cu | 9.4 | 3.6 | 71 | 1.20 | 178 | >1000 |
| *47 | Pyroceram | 1500 | H$_2$ + N$_2$ | W | 0.8 | 12.2 | 16 | 0.10 | 19520 | 50 |
| 48 | " | 1500 | H$_2$ + N$_2$ | W | 0.8 | 12.2 | 16 | 0.60 | 542 | >1000 |
| *49 | " | 1500 | H$_2$ + N$_2$ | W | 0.8 | 12.2 | 71 | 0.40 | 5414 | 650 |
| 50 | " | 1500 | H$_2$ + N$_2$ | W | 0.8 | 12.2 | 71 | 1.20 | 602 | >1000 |

Samples marked with * lie outside the scope of the invention.

As will be obvious from Tables 1 and 2, no change in the resistance was at all recognized up to 1000 cycles by the samples having values F1 of not larger than 2000, the values F1 being determined by a maximum distance L between the connection terminals corresponding to a maximum length of the insulating board, a difference Δα in the coefficient of thermal expansion from the mother board, and height H of brazing between the insulating board and the mother board, and very stable and favorable electrically connected state was maintained. It was, however, learned that the samples having values F1 of larger than 2000 exhibited a change in the resistance before 1000 cycles, and lacked reliability in the electric connection.

(Example 2)

A lithium silicate glass (74% by weight of SiO$_2$, 14% by weight of Si$_2$O, 4% by weight of Al$_2$O$_3$, 2% by weight of K$_2$O, 2% by weight of P$_2$O$_5$, 2% by weight of Na$_2$O, 2% by weight of ZnO, an yield point of 480° C. and a coefficient of thermal expansion of 10.3 ppm/° C. at 40 to 400° C.) and alumina were mixed together at various ratios as shown in Table 3, and were molded in the same manner as in Example 1, followed by the removal of the binder and firing. The coefficients of thermal expansion of the thus obtained sintered products were confirmed in the same manner as in Example 1.

Wiring boards were prepared in the same manner as in Example 1 by using copper as metallizing wiring layers, mounted on the same glass-epoxy board as that of Example 1, and were subjected to the heat cycle testing to examine changes in the electric resistance between the printed boards and the wiring boards.

TABLE 3

| Sample No. | Insulating board Material (% by vol.) glass | Insulating board Material (% by vol.) Al$_2$O$_3$ | Firing condition temp. (° C.) | Firing condition atmosphere | Coefficient of thermal expansion (ppm/° C.) | Difference in thermal expansoin Δα (ppm/° C.) | Max. distance L (mm) | Height H of soldering (mm) | F1 value | Result of heat cycle testing (times) |
|---|---|---|---|---|---|---|---|---|---|---|
| *51 | 5 | 95 | 1000 | N$_2$ | 6.0 | 7.0 | 16 | 0.10 | 11200 | 250 |
| 52 | 5 | 95 | 1000 | N$_2$ | 6.0 | 7.0 | 16 | 0.40 | 700 | >1000 |
| 53 | 5 | 95 | 1000 | N$_2$ | 6.0 | 7.0 | 16 | 0.60 | 311 | >1000 |
| *54 | 5 | 95 | 1000 | N$_2$ | 6.0 | 7.0 | 71 | 0.40 | 3106 | 850 |
| 55 | 5 | 95 | 1000 | N$_2$ | 6.0 | 7.0 | 71 | 0.60 | 1381 | >1000 |
| 56 | 5 | 95 | 1000 | N$_2$ | 6.0 | 7.0 | 71 | 0.80 | 777 | >1000 |
| 57 | 5 | 95 | 1000 | N$_2$ | 6.0 | 7.0 | 71 | 1.00 | 497 | >1000 |
| 58 | 5 | 95 | 1000 | N$_2$ | 6.0 | 7.0 | 71 | 1.20 | 345 | >1000 |
| *59 | 20 | 80 | 950 | N$_2$ | 7.5 | 5.5 | 16 | 0.10 | 8800 | 350 |
| 60 | 20 | 80 | 950 | N$_2$ | 7.5 | 5.5 | 16 | 0.60 | 244 | >1000 |
| *61 | 20 | 80 | 950 | N$_2$ | 7.5 | 5.5 | 71 | 0.40 | 2441 | 850 |
| 62 | 20 | 80 | 950 | N$_2$ | 7.5 | 5.5 | 71 | 1.20 | 271 | >1000 |
| *63 | 50 | 50 | 800 | N$_2$ | 10.9 | 2.1 | 16 | 0.10 | 3360 | 850 |
| 64 | 50 | 50 | 800 | N$_2$ | 10.9 | 2.1 | 16 | 0.60 | 93 | >1000 |
| 65 | 50 | 50 | 800 | N$_2$ | 10.9 | 2.1 | 71 | 0.40 | 932 | >1000 |
| 66 | 50 | 50 | 800 | N$_2$ | 10.9 | 2.1 | 71 | 1.20 | 104 | >1000 |
| 67 | 70 | 30 | 800 | N$_2$ | 12.5 | 0.5 | 16 | 0.10 | 800 | >1000 |
| 68 | 70 | 30 | 800 | N$_2$ | 12.5 | 0.5 | 16 | 0.60 | 22 | >1000 |
| 69 | 70 | 30 | 800 | N$_2$ | 12.5 | 0.5 | 71 | 0.40 | 222 | >1000 |
| 70 | 70 | 30 | 800 | N$_2$ | 12.5 | 0.5 | 71 | 1.20 | 25 | >1000 |
| 71 | 90 | 10 | 800 | N$_2$ | 14.1 | 1.1 | 16 | 0.10 | 1760 | >1000 |
| 72 | 90 | 10 | 800 | N$_2$ | 14.1 | 1.1 | 16 | 0.60 | 49 | >1000 |

TABLE 3-continued

| Sample No. | Insulating board Material (% by vol.) | | Firing condition | | Coefficient of thermal expansion (ppm/° C.) | Difference in thermal expansoin Δα (ppm/° C.) | Max. distance L (mm) | Height H of soldering (mm) | F1 value | Result of heat cycle testing (times) |
|---|---|---|---|---|---|---|---|---|---|---|
| | glass | Al₂O₃ | temp. (° C.) | atmos-phere | | | | | | |
| 73 | 90 | 10 | 800 | N₂ | 14.1 | 1.1 | 71 | 0.40 | 488 | >1000 |
| 74 | 90 | 10 | 800 | N₂ | 14.1 | 1.1 | 71 | 1.20 | 54 | >1000 |

Samples marked with * lie outside the scope of the invention.

As will be obvious from Table 3, no change in the resistance was at all recognized up to 1000 cycles by the samples having values F1 of not larger than 2000, the values F1 being determined by a maximum distance L between the connection terminals corresponding to a maximum length of the insulating board, a difference Δα in the coefficient of thermal expansion from the mother board, and height H of brazing between the insulating board and the mother board, and very stable and favorable electrically connected state was maintained. It was, however, learned that the samples having values F1 of larger than 2000 exhibited a change in the electric resistance before 1000 cycles due to a breakage in the connection portions.

(Example 3)

A lithium silicate glass (78% by weight of SiO₂, 10% by weight of Li₂O, 4% by weight of Al₂O₃, 4% by weight of K₂O, 2% by weight of P₂O₅, 2% by weight of Na₂O, an yield point of 480° C. and a coefficient of thermal expansion of 10.3 ppm/°C. at 40 to 400° C.) and various fillers such as forsterite, cristobalite, petalite, nepheline and lithium silicate were mixed together at various ratios as shown in Tables 4 and 5, and were molded in the same manner as in Example 1, followed by the removal of the binder and firing. The Young's moduli and coefficients of thermal expansion of the thus obtained sintered products were confirmed in the same manner as in Example 1.

Green sheets were prepared in the same manner as in Example 1, a copper-metallizing paste was applied in the form of wiring patterns by the screen-printing method, through-holes were formed in predetermined portions of the sheet so as to reach the lower surface of the board and were filled with the copper-metallizing paste. The green sheets were laminated, adhered with pressure, and were fired to prepare a wiring board for package in the same manner as in Example 1. The wiring board for package was mounted on the surface of the printed board, and was subjected to the heat cycle testing up to a maximum of 1000 cycles in the same manner as in Example 1.

TABLE 4

| Sample No. | Insulating board Material (% by vol.) | | | | Firing condition | | Coefficient of thermal expansion (ppm/° C.) | Difference in thermal expansoin Δα (ppm/° C.) | Max. distance L (mm) | Height H of soldering (mm) | F1 value | Result of heat cycle testing (times) |
|---|---|---|---|---|---|---|---|---|---|---|---|---|
| | glass | fors-terite | Quartz | Others | temp. (° C.) | atmos-phere | | | | | | |
| *75 | 20 | 80 | — | — | 1100 | N₂ | 5.5 | 5.5 | 16 | 0.10 | 8800 | 300 |
| 76 | 20 | 80 | — | — | 1100 | N₂ | 5.5 | 5.5 | 16 | 0.60 | 244 | >1000 |
| *77 | 20 | 80 | — | — | 1100 | N₂ | 5.5 | 5.5 | 71 | 0.40 | 2441 | 950 |
| 78 | 20 | 80 | — | — | 1100 | N₂ | 5.5 | 5.5 | 71 | 1.20 | 271 | >1000 |
| *79 | 30 | 70 | — | — | 1100 | N₂ | 9.4 | 3.6 | 16 | 0.10 | 5760 | 600 |
| 80 | 30 | 70 | — | — | 1100 | N₂ | 9.4 | 3.6 | 16 | 0.60 | 160 | >1000 |
| 81 | 30 | 70 | — | — | 1100 | N₂ | 9.4 | 3.6 | 71 | 0.40 | 1598 | >1000 |
| 82 | 30 | 70 | — | — | 1100 | N₂ | 9.4 | 3.6 | 71 | 1.20 | 178 | >1000 |
| 83 | 50 | 25 | 25 | — | 1000 | N₂ | 14.0 | 1.0 | 16 | 0.10 | 1600 | >1000 |
| 84 | 50 | 25 | 25 | — | 1000 | N₂ | 14.0 | 1.0 | 16 | 0.60 | 44 | >1000 |
| 85 | 50 | 25 | 25 | — | 1000 | N₂ | 14.0 | 1.0 | 71 | 0.40 | 444 | >1000 |
| 86 | 50 | 25 | 25 | — | 1000 | N₂ | 14.0 | 1.0 | 71 | 1.20 | 49 | >1000 |
| *87 | 50 | 50 | — | — | 1000 | N₂ | 11.7 | 1.3 | 16 | 0.10 | 2080 | 950 |
| 88 | 50 | 50 | — | — | 1000 | N₂ | 11.7 | 1.3 | 16 | 0.60 | 58 | >1000 |
| 89 | 50 | 50 | — | — | 1000 | N₂ | 11.7 | 1.3 | 71 | 0.40 | 577 | >1000 |
| 90 | 50 | 50 | — | — | 1000 | N₂ | 11.7 | 1.3 | 71 | 1.20 | 64 | >1000 |
| *91 | 50 | — | 50 | — | 1000 | N₂ | 21.0 | 8.0 | 16 | 0.10 | 12800 | 150 |
| 92 | 50 | — | 50 | — | 1000 | N₂ | 21.0 | 8.0 | 16 | 0.60 | 356 | >1000 |
| *93 | 50 | — | 50 | — | 1000 | N₂ | 21.0 | 8.0 | 71 | 0.40 | 3550 | 850 |
| 94 | 50 | — | 50 | — | 1000 | N₂ | 21.0 | 8.0 | 71 | 1.20 | 394 | >1000 |
| *95 | 35 | 30 | 35 | — | 1000 | N₂ | 14.6 | 1.6 | 16 | 0.10 | 2560 | 900 |
| 96 | 35 | 30 | 35 | — | 1000 | N₂ | 14.6 | 1.6 | 16 | 0.60 | 71 | >1000 |
| 97 | 35 | 30 | 35 | — | 1000 | N₂ | 14.6 | 1.6 | 71 | 0.40 | 710 | >1000 |
| 98 | 35 | 30 | 35 | — | 1000 | N₂ | 14.6 | 1.6 | 71 | 1.20 | 79 | >1000 |
| *99 | 35 | 30 | 30 | petalite 5 | 950 | N₂ | 13.2 | 0.2 | 16 | 0.10 | 320 | >1000 |
| 100 | 35 | 30 | 30 | petalite 5 | 950 | N₂ | 13.2 | 0.2 | 16 | 0.60 | 9 | >1000 |

TABLE 4-continued

| | Insulating board Material (% by vol.) | | | | Firing condition | | Coefficient of thermal expansion (ppm/° C.) | Difference in thermal expansoin Δα (ppm/° C.) | Max. distance L (mm) | Height H of soldering (mm) | F1 value | Result of heat cycle testing (times) |
|---|---|---|---|---|---|---|---|---|---|---|---|---|
| Sample No. | glass | forsterite | Quartz | Others | temp. (° C.) | atmosphere | | | | | | |
| 101 | 35 | 30 | 30 | petalite 5 | 950 | $N_2$ | 13.2 | 0.2 | 71 | 0.40 | 89 | >1000 |
| 102 | 35 | 30 | 30 | petalite 5 | 950 | $N_2$ | 13.2 | 0.2 | 71 | 1.20 | 10 | >1000 |
| 103 | 35 | 30 | 30 | nepheline 5 | 950 | $N_2$ | 13.5 | 0.5 | 16 | 0.10 | 800 | >1000 |
| 104 | 35 | 30 | 30 | nepheline 5 | 950 | $N_2$ | 13.5 | 0.5 | 16 | 0.60 | 22 | >1000 |
| 105 | 35 | 30 | 30 | nepheline 5 | 950 | $N_2$ | 13.5 | 0.5 | 71 | 0.40 | 222 | >1000 |
| 106 | 35 | 30 | 30 | nepheline 5 | 950 | $N_2$ | 13.5 | 0.5 | 71 | 1.20 | 25 | >1000 |

Samples marked with * lie outside the scope of the invention.

TABLE 5

| | Insulating board Material (% by vol.) | | | | Firing condition | | Coefficient of thermal expansion (ppm/° C.) | Difference in thermal expansoin Δα (ppm/° C.) | Max. distance L (mm) | Height H of soldering (mm) | F1 value | Result of heat cycle testing (times) |
|---|---|---|---|---|---|---|---|---|---|---|---|---|
| Sample No. | glass | forsterite | Quartz | Others | temp. (° C.) | atmosphere | | | | | | |
| 107 | 45 | 25 | 25 | lithium silicate 5 | 950 | $N_2$ | 13.5 | 0.5 | 16 | 0.10 | 800 | >1000 |
| 108 | 45 | 25 | 25 | lithium silicate 5 | 950 | $N_2$ | 13.5 | 0.5 | 16 | 0.60 | 22 | >1000 |
| 109 | 45 | 25 | 25 | lithium silicate 5 | 950 | $N_2$ | 13.5 | 0.5 | 71 | 0.40 | 222 | >1000 |
| 110 | 45 | 25 | 25 | lithium silicate 5 | 950 | $N_2$ | 13.5 | 0.5 | 71 | 1.20 | 24 | >1000 |
| *111 | 35 | 25 | 40 | — | 900 | $N_2$ | 17.2 | 4.2 | 16 | 0.10 | 6720 | 650 |
| 112 | 35 | 25 | 40 | — | 900 | $N_2$ | 17.2 | 4.2 | 16 | 0.60 | 187 | >1000 |
| 113 | 35 | 25 | 40 | — | 900 | $N_2$ | 17.2 | 4.2 | 71 | 0.40 | 1864 | >1000 |
| 114 | 35 | 25 | 40 | — | 900 | $N_2$ | 17.2 | 4.2 | 71 | 1.20 | 207 | >1000 |

Samples marked with * lie outside the scope of the invention.

As will be obvious from Tables 4 and 5, no change in the resistance was at all recognized up to 1000 cycles by the samples having values F1 of not larger than 2000, the values F1 being determined by a maximum distance L between the connection terminals corresponding to a maximum length of the insulating board, a difference Δα in the coefficient of thermal expansion from the mother board, and height H of brazing between the insulating board and the mother board, and very stable and favorable electrically connected state was maintained. It was, however, learned that the samples having values F1 of larger than 2000 exhibited a change in the electric resistance before 1000 cycles and lacked reliability after the mounting.

(Example 4)

Various ceramic materials shown in Table 6 were fired under firing conditions shown in Table 6 to prepare sintered products (insulating boards) of a size of 5×4×40 mm, which were then measured for their Young's moduli and coefficients of thermal expansion at 40 to 400° C. The results were as shown in Table 6.

By using the above various ceramic materials, wiring boards were prepared in the same manner as in Example 1.

There were further prepared a wiring board having 356 terminals and a maximum distance L of 30 mm between the connection terminals, and a wiring board having 732 terminals and a maximum distance L of 71 mm between the connection terminals. The wiring boards possessed thicknesses of 1.2 mm and 1.8 mm.

As the mother board, a printed board was prepared by forming wiring condoctors of a copper foil on the surface of a glass-epoxy board having a coefficient of thermal expansion of 13 ppm/°C. at 40 to 400° C.

The wiring board was so positioned that the connection terminals of the wiring board were connected to the wiring conductors on the printed board, and was mounted on the surface of the printed board by using the low-melting solder. The height of brazing in this case was 0.3 mm.

The structure in which the wiring board was mounted on the surface of the printed board as described above, was subjected to the heat cycle testing in the same manner as in Example 1. The results were as shown in Table 6.

TABLE 6

| Sample No. | Insulating board Material (% by vol.) | condition temp. (° C.) | condition atmosphere | Metalized wiring layer | Coefficient of thermal expansion (ppm/° C.) | Difference in thermal expansion Δα (ppm/° C.) | Young's modulus E (GPa) | Max. distance L (mm) | Thickness t (mm) | F2 value | Result of heat cycle testing (times) |
|---|---|---|---|---|---|---|---|---|---|---|---|
| 1 | 70 boron silicate glass - 30Al$_2$O$_3$ | 950 | N$_2$ | Cu | 6.0 | 7.0 | 100 | 30 | 1.2 | 225 | 950 |
| 2 | 70 boron silicate glass - 30Al$_2$O$_3$ | 950 | N$_2$ | Cu | 6.0 | 7.0 | 100 | 30 | 1.8 | 370 | 800 |
| 3 | 70 boron silicate glass - 30Al$_2$O$_3$ | 950 | N$_2$ | Cu | 6.0 | 7.0 | 100 | 71 | 1.2 | 234 | 950 |
| 4 | 70 boron silicate glass - 30Al$_2$O$_3$ | 950 | N$_2$ | Cu | 6.0 | 7.0 | 100 | 71 | 1.8 | 787 | 400 |
| 5 | 100 boron silicate glass | 800 | N$_2$ | Cu | 3.2 | 9.8 | 63 | 30 | 1.2 | 292 | 850 |
| 6 | 100 boron silicate glass | 800 | N$_2$ | Cu | 3.2 | 9.8 | 63 | 30 | 1.8 | 511 | 650 |
| 7 | 100 boron silicate glass | 800 | N$_2$ | Cu | 3.2 | 9.8 | 63 | 71 | 1.2 | 29 | >1000 |
| 8 | 100 boron silicate glass | 800 | N$_2$ | Cu | 3.2 | 9.8 | 63 | 71 | 1.8 | 1014 | 150 |
| 9 | 95ZrO$_2$—5CaO | 1500 | H$_2$ + N$_2$ | W | 10.0 | 3.0 | 160 | 30 | 1.2 | 101 | >1000 |
| 10 | " | 1500 | H$_2$ + N$_2$ | W | 10.0 | 3.0 | 160 | 30 | 1.8 | 160 | >1000 |
| 11 | " | 1500 | H$_2$ + N$_2$ | W | 10.0 | 3.0 | 160 | 71 | 1.2 | 159 | >1000 |
| 12 | " | 1500 | H$_2$ + N$_2$ | W | 10.0 | 3.0 | 160 | 71 | 1.8 | 335 | 800 |
| 13 | 96Al$_2$O$_3$—4SiO$_2$, MgO | 1600 | H$_2$ + N$_2$ | W | 6.7 | 6.3 | 340 | 30 | 1.2 | 220 | 950 |
| 14 | " | 1600 | H$_2$ + N$_2$ | W | 6.7 | 6.3 | 340 | 30 | 1.8 | 338 | 850 |
| 15 | " | 1600 | H$_2$ + N$_2$ | W | 6.7 | 6.3 | 340 | 71 | 1.2 | 441 | 750 |
| 16 | " | 1600 | H$_2$ + N$_2$ | W | 6.7 | 6.3 | 340 | 71 | 1.8 | 777 | 400 |
| 17 | 95AlN—5Y$_2$O$_3$ | 1800 | H$_2$ + N$_2$ | W | 4.3 | 8.7 | 310 | 30 | 1.2 | 302 | 850 |
| 18 | " | 1800 | H$_2$ + N$_2$ | W | 4.3 | 8.7 | 310 | 30 | 1.8 | 467 | 750 |
| 19 | " | 1800 | H$_2$ + N$_2$ | W | 4.3 | 8.7 | 310 | 71 | 1.2 | 596 | 600 |
| 20 | " | 1800 | H$_2$ + N$_2$ | W | 4.3 | 8.7 | 310 | 71 | 1.8 | 1069 | 150 |
| 21 | 95SiC—5B | 1900 | H$_2$ + N$_2$ | W | 5.5 | 7.5 | 440 | 30 | 1.2 | 263 | 950 |
| 22 | " | 1900 | H$_2$ + N$_2$ | W | 5.5 | 7.5 | 440 | 30 | 1.8 | 403 | 750 |
| 23 | " | 1900 | H$_2$ + N$_2$ | W | 5.5 | 7.5 | 440 | 71 | 1.2 | 551 | 650 |
| 24 | " | 1190 | H$_2$ + N$_2$ | W | 5.5 | 7.5 | 440 | 71 | 1.8 | 932 | 200 |
| 25 | 100 mullite | 1600 | H$_2$ + N$_2$ | W | 5.7 | 7.3 | 145 | 30 | 1.2 | 243 | 950 |
| 26 | " | 1600 | H$_2$ + N$_2$ | W | 5.7 | 7.3 | 145 | 30 | 1.8 | 388 | 750 |
| 27 | " | 1600 | H$_2$ + N$_2$ | W | 5.7 | 7.3 | 145 | 71 | 1.2 | 361 | 850 |
| 28 | " | 1600 | H$_2$ + N$_2$ | W | 5.7 | 7.3 | 145 | 71 | 1.8 | 856 | 300 |
| 29 | 95Si$_3$N$_6$—5Y$_2$O$_3$ | 1800 | H$_2$ + N$_2$ | W | 3.0 | 10.0 | 304 | 30 | 1.2 | 347 | 850 |
| 30 | " | 1800 | H$_2$ + N$_2$ | W | 3.0 | 10.0 | 304 | 30 | 1.8 | 536 | 650 |
| 31 | " | 1800 | H$_2$ + N$_2$ | W | 3.0 | 10.0 | 304 | 71 | 1.2 | 682 | 500 |
| 32 | " | 1800 | H$_2$ + N$_2$ | W | 3.0 | 10.0 | 304 | 71 | 1.8 | 1228 | 50 |
| 33 | 100 soda-lime glass | 900 | N$_2$ | Cu | 9.4 | 3.6 | 72 | 30 | 1.2 | 110 | >1000 |
| 34 | " | 900 | N$_2$ | Cu | 9.4 | 3.6 | 72 | 30 | 1.8 | 189 | >1000 |
| 35 | " | 900 | N$_2$ | Cu | 9.4 | 3.6 | 72 | 71 | 1.2 | 48 | >1000 |
| 36 | " | 900 | N$_2$ | Cu | 9.4 | 3.6 | 72 | 71 | 1.8 | 383 | 800 |
| 37 | pyroceram | 1500 | H$_2$ + N$_2$ | W | 0.8 | 12.2 | 87 | 30 | 1.2 | 384 | 800 |
| 38 | " | 1500 | H$_2$ + N$_2$ | W | 0.8 | 12.2 | 87 | 30 | 1.8 | 643 | 550 |
| 39 | " | 1500 | H$_2$ + N$_2$ | W | 0.8 | 12.2 | 87 | 71 | 1.2 | 313 | 850 |
| 40 | " | 1500 | H$_2$ + N$_2$ | W | 0.8 | 12.2 | 87 | 71 | 1.8 | 1344 | 50 |

As will be obvious from Table 6, no change in the resistance was at all recognized up to 1000 cycles by the samples having values F2 of not larger than 200, the values F2 being determined by a maximum distance L between the connection terminals of the board, a thickness t, a Young's modulus E and a difference Δα in the coefficient of thermal expansion from the mother board, and very stable and favorable electrically connected state was maintained. It was, however, learned that the samples having values F1 of larger than 200 exhibited a change in the electric resistance before 1000 cycles and lacked reliability in the electric connection. From the results of Table 6, satisfactory results were not almost obtained from those in which the insulating board possessed a coefficient of thermal expansion of smaller than 8 ppm/°C.

(Example 5)

A lithium silicate glass (74% by weight of SiO$_2$, 14% by weight of Li$_2$O, 4% by weight of Al$_2$O$_3$, 2% by weight of K$_2$O, 2% by weight of P$_2$O$_5$, 2% by weight of Na$_2$O, 2% by weight of ZnO, an yield point of 480° C. and a coefficient of thermal expansion of 10.3 ppm/°C. at 40 to 400° C.) and alumina were mixed together at various ratios as shown in Table 7, and were molded in the same manner as in Example 4, followed by the removal of the binder and firing. The Young's modulus and coefficients of thermal expansion of the thus obtained sintered products were measured in the same manner as in Example 4.

Wiring boards were prepared in the same manner as in Example 4 by using copper as metallized wiring layers, mounted on the same glass-epoxy board as that of Example 1, and were subjected to the heat cycle testing to examine changes in the electric resistance between the printed boards and the wiring boards.

TABLE 7

| Sample No. | Insulating Board Material (% by vol.) | | Firing condition | | Coefficient of thermal expansion (ppm/° C.) | Difference in thermal expansoin Δα (ppm/° C.) | Young's modulus E (GPa) | Max. distance L (mm) | Thickness t (mm) | F2 value | Result of heating cycle testing (times) |
|---|---|---|---|---|---|---|---|---|---|---|---|
| | glass | Al₂O₃ | temp. (° C.) | atmos- phere | | | | | | | |
| 41 | 5 | 95 | 1000 | N₂ | 6.0 | 7.0 | 320 | 30 | 1.2 | 243 | 900 |
| 42 | 5 | 95 | 1000 | N₂ | 6.0 | 7.0 | 320 | 30 | 1.8 | 375 | 800 |
| 43 | 5 | 95 | 1000 | N₂ | 6.0 | 7.0 | 320 | 71 | 1.2 | 483 | 650 |
| 44 | 5 | 95 | 1000 | N₂ | 6.0 | 7.0 | 320 | 71 | 1.8 | 861 | 300 |
| 45 | 20 | 80 | 950 | N₂ | 7.5 | 5.5 | 260 | 30 | 1.2 | 190 | >1000 |
| 46 | 20 | 80 | 950 | N₂ | 7.5 | 5.5 | 260 | 30 | 1.8 | 295 | 800 |
| 47 | 20 | 80 | 950 | N₂ | 7.5 | 5.5 | 260 | 71 | 1.2 | 359 | 850 |
| 48 | 20 | 80 | 950 | N₂ | 7.5 | 5.5 | 260 | 71 | 1.8 | 670 | 500 |
| 49 | 50 | 50 | 800 | N₂ | 10.9 | 2.1 | 170 | 30 | 1.2 | 71 | >1000 |
| 50 | 50 | 50 | 800 | N₂ | 10.9 | 2.1 | 170 | 30 | 1.8 | 112 | >1000 |
| 51 | 50 | 50 | 800 | N₂ | 10.5 | 2.1 | 170 | 71 | 1.2 | 115 | >1000 |
| 52 | 50 | 50 | 800 | N₂ | 10.9 | 2.1 | 170 | 71 | 1.8 | 249 | 900 |
| 53 | 70 | 30 | 800 | N₂ | 12.5 | 0.5 | 110 | 30 | 1.2 | 16 | >1000 |
| 54 | 70 | 30 | 800 | N₂ | 12.5 | 0.5 | 110 | 30 | 1.8 | 26 | >1000 |
| 55 | 70 | 30 | 800 | N₂ | 12.5 | 0.5 | 110 | 71 | 1.2 | 19 | >1000 |
| 56 | 70 | 30 | 800 | N₂ | 12.5 | 0.5 | 110 | 71 | 1.8 | 57 | >1000 |
| 57 | 90 | 10 | 800 | N₂ | 14.1 | 1.1 | 95 | 30 | 1.2 | 35 | >1000 |
| 58 | 90 | 10 | 800 | N₂ | 14.1 | 1.1 | 95 | 30 | 1.8 | 58 | >1000 |
| 59 | 90 | 10 | 800 | N₂ | 14.1 | 1.1 | 95 | 71 | 1.2 | 34 | >1000 |
| 60 | 90 | 10 | 800 | N₂ | 14.1 | 1.1 | 95 | 71 | 1.8 | 123 | >1000 |

As will be obvious from FIG. 7, no change in the resistance was at all recognized before 1000 cycles by the samples having values F2 of not larger than 200, and very stable and favorable electrically connected state was maintained. However, the samples having F2 values of smaller than 200 exhibited changes in the electric resistance before 1000 cycles due to breakage in the connection portions.

(Example 6)

A lithium silicate glass (78% by weight of $SiO_2$, 10% by weight of $Li_2O$, 4% by weight of $Al_2O_3$, 4% by weight of $K_2O$, 2% by weight of $P_2O_5$, 2% by weight of $Na_2O$, an yield point of 480° C. and a coefficient of thermal expansion of 10.3 ppm/°C. at 40 to 400° C.) as well as forsterite, quartz, cristobalite, petalite, nepheline and lithium silicate were mixed together at various ratios as shown in Tables 8 and 9 and were molded in the same manner as in Example 4, followed by the removal of the binder and firing. The Young's moduli and coefficients of thermal expansion of the thus obtained sintered products were confirmed in the same manner as in Example 4.

Green sheets were prepared in the same manner as in Example 4, a copper-metallizing paste was applied in the form of wiring patterns by the screen-printing method, through-holes were formed in the predetermined portions of the sheet so as to reach the lower surface of the board and were filled with the copper-metallizing paste. The green sheets were laminated, adhered with pressure, and were fired to prepare a wiring board for package in the same manner as in Example 4. The wiring board for package was mounted on the surface of the printed board, and was subjected to the heat cycle testing up to a maximum of 1000 cycles in the same manner as in Example 4. The results were as shown in Tables 8 and 9.

TABLE 8

| Sample No. | Insulating board Material (% by vol.) | | | | Firing condition | | Coefficient of thermal expansion (ppm/° C.) | Difference in thermal expansoin Δα (ppm/° C.) | Young's modulus E (GPa) | Max. distance L (mm) | Thickness t (mm) | F2 value | Result of heat cycle testing (times) |
|---|---|---|---|---|---|---|---|---|---|---|---|---|---|
| | glass | forsterite | Quartz | Others | temp. (° C.) | atmos- phere | | | | | | | |
| 61 | 20 | 80 | — | — | 1100 | N₂ | 5.5 | 5.5 | 142 | 30 | 1.2 | 183 | >1000 |
| 62 | 20 | 80 | — | — | 1100 | N₂ | 5.5 | 5.5 | 142 | 30 | 1.8 | 293 | 850 |
| 63 | 20 | 80 | — | — | 1100 | N₂ | 5.5 | 5.5 | 142 | 71 | 1.2 | 268 | 900 |
| 64 | 20 | 80 | — | — | 1100 | N₂ | 5.5 | 5.5 | 142 | 71 | 1.8 | 643 | 500 |
| 65 | 30 | 70 | — | — | 1100 | N₂ | 9.4 | 3.6 | 127 | 30 | 1.2 | 119 | >1000 |
| 66 | 30 | 70 | — | — | 1100 | N₂ | 9.4 | 3.6 | 127 | 30 | 1.8 | 191 | >1000 |
| 67 | 30 | 70 | — | — | 1100 | N₂ | 9.4 | 3.6 | 127 | 71 | 1.2 | 160 | >1000 |
| 68 | 30 | 70 | — | — | 1100 | N₂ | 9.4 | 3.6 | 127 | 71 | 1.8 | 417 | 750 |
| 69 | 50 | 25 | 25 | — | 1000 | N₂ | 14.0 | 1.0 | 103 | 30 | 1.2 | 32 | >1000 |
| 70 | 50 | 25 | 25 | — | 1000 | N₂ | 14.0 | 1.0 | 103 | 30 | 1.8 | 53 | >1000 |
| 71 | 50 | 25 | 25 | — | 1000 | N₂ | 14.0 | 1.0 | 103 | 71 | 1.2 | 35 | >1000 |

TABLE 8-continued

| Sample No. | Insulating board Material (% by vol.) | | | | Firing condition | | Coefficient of thermal expansion (ppm/° C.) | Difference in thermal expansoin Δα (ppm/° C.) | Young's modulus E (GPa) | Max. distance L (mm) | Thickness t (mm) | F2 value | Result of heat cycle testing (times) |
|---|---|---|---|---|---|---|---|---|---|---|---|---|---|
| | glass | forsterite | Quartz | Others | temp. (° C.) | atmosphere | | | | | | | |
| 72 | 50 | 25 | 25 | — | 1000 | $N_2$ | 14.0 | 1.0 | 103 | 71 | 1.8 | 113 | >1000 |
| 73 | 50 | 50 | — | — | 1000 | $N_2$ | 11.7 | 1.3 | 105 | 30 | 1.2 | 42 | >1000 |
| 74 | 50 | 50 | — | — | 1000 | $N_2$ | 11.7 | 1.3 | 108 | 30 | 1.8 | 69 | >1000 |
| 75 | 50 | 50 | — | — | 1000 | $N_2$ | 11.7 | 1.3 | 108 | 71 | 1.2 | 48 | >1000 |
| 76 | 50 | 50 | — | — | 1000 | $N_2$ | 11.7 | 1.3 | 108 | 71 | 1.8 | 148 | >1000 |
| 77 | 50 | — | 50 | — | 1000 | $N_2$ | 21.0 | 8.0 | 105 | 30 | 1.2 | 258 | 950 |
| 78 | 50 | — | 50 | — | 1000 | $N_2$ | 21.0 | 8.0 | 105 | 30 | 1.8 | 423 | 750 |
| 79 | 50 | — | 50 | — | 1000 | $N_2$ | 21.0 | 8.0 | 105 | 71 | 1.2 | 287 | 850 |
| 80 | 50 | — | 50 | — | 1000 | $N_2$ | 21.0 | 8.0 | 105 | 71 | 1.8 | 906 | 250 |
| 81 | 35 | 30 | 35 | — | 1000 | $N_2$ | 14.6 | 1.6 | 114 | 30 | 1.2 | 52 | >1000 |
| 82 | 35 | 30 | 35 | — | 1000 | $N_2$ | 14.6 | 1.6 | 114 | 30 | 1.8 | 85 | >1000 |
| 83 | 35 | 30 | 35 | — | 1000 | $N_2$ | 14.6 | 1.6 | 114 | 71 | 1.2 | 64 | >1000 |
| 84 | 35 | 30 | 35 | — | 1000 | $N_2$ | 14.6 | 1.6 | 114 | 71 | 1.8 | 183 | >1000 |
| 85 | 35 | 30 | 30 | petalite 5 | 950 | $N_2$ | 13.2 | 0.2 | 117 | 30 | 1.2 | 7 | >1000 |
| 86 | 35 | 30 | 30 | petalite 5 | 950 | $N_2$ | 13.2 | 0.2 | 117 | 30 | 1.8 | 11 | >1000 |
| 87 | 35 | 30 | 30 | petalite 5 | 950 | $N_2$ | 13.2 | 0.2 | 117 | 71 | 1.2 | 8 | >1000 |
| 88 | 35 | 30 | 30 | petalite 5 | 950 | $N_2$ | 13.2 | 0.2 | 117 | 71 | 1.8 | 23 | >1000 |
| 89 | 35 | 30 | 30 | nepheline 5 | 950 | $N_2$ | 13.5 | 0.5 | 120 | 30 | 1.2 | 16 | >1000 |
| 90 | 35 | 30 | 30 | nepheline 5 | 950 | $N_2$ | 13.5 | 0.5 | 120 | 30 | 1.8 | 27 | >1000 |
| 91 | 35 | 30 | 30 | nepheline 5 | 950 | $N_2$ | 13.5 | 0.5 | 120 | 71 | 1.2 | 21 | >1000 |
| 92 | 35 | 30 | 30 | nepheline 5 | 950 | $N_2$ | 13.5 | 0.5 | 120 | 71 | 1.8 | 58 | >1000 |

TABLE 9

| Sample No. | Insulating board Material (% by vol.) | | | | Firing condition | | Coefficient of thermal expansion (ppm/° C.) | Difference in thermal expansoin Δα (ppm/° C.) | Young's modulus E (GPa) | Max. distance L (mm) | Thickness t (mm) | F2 value | Result of heat cycle testing (times) |
|---|---|---|---|---|---|---|---|---|---|---|---|---|---|
| | glass | forsterite | Quartz | Others | temp. (° C.) | atmosphere | | | | | | | |
| 93 | 45 | 25 | 25 | lithium silicate 5 | 950 | $N_2$ | 13.5 | 0.5 | 122 | 30 | 1.2 | 16 | >1000 |
| 94 | 45 | 25 | 25 | lithium silicate 5 | 950 | $N_2$ | 13.5 | 0.5 | 122 | 30 | 1.8 | 27 | >1000 |
| 95 | 45 | 25 | 25 | lithium silicate 5 | 950 | $N_2$ | 13.5 | 0.5 | 122 | 71 | 1.2 | 21 | >1000 |
| 96 | 45 | 25 | 25 | lithium silicate 5 | 950 | $N_2$ | 13.5 | 0.5 | 122 | 71 | 1.8 | 58 | >1000 |
| 97 | 35 | 25 | 40 | — | 900 | $N_2$ | 17.2 | 4.2 | 118 | 30 | 1.2 | 137 | >1000 |
| 98 | 35 | 25 | 40 | — | 900 | $N_2$ | 17.2 | 4.2 | 118 | 30 | 1.8 | 223 | 950 |
| 99 | 35 | 25 | 40 | — | 900 | $N_2$ | 17.2 | 4.2 | 118 | 71 | 1.2 | 174 | >1000 |
| 100 | 35 | 25 | 40 | — | 900 | $N_2$ | 17.2 | 4.2 | 118 | 71 | 1.8 | 482 | 650 |
| 101 | 35 | 30 | — | cristobalite 35 | 900 | $N_2$ | 15.0 | 2.0 | 110 | 30 | 1.2 | 65 | >1000 |
| 102 | 35 | 30 | — | cristobalite 35 | 900 | $N_2$ | 15.0 | 2.0 | 110 | 30 | 1.8 | 106 | >1000 |
| 103 | 35 | 30 | — | cristobalite 35 | 900 | $N_2$ | 15.0 | 2.0 | 110 | 71 | 1.2 | 76 | >1000 |
| 104 | 35 | 30 | — | cristobalite 35 | 900 | $N_2$ | 15.0 | 2.0 | 110 | 71 | 1.8 | 228 | 950 |

As will be obvious from Tables 8 and 9, no change in the resistance was at all recognized before 1000 cycles by the samples having values F2 of not larger than 200, and very stable and favorable electrically connected state was maintained. It was, however, learned that the samples having F2 values of larger than 200 exhibited changes in the electric resistance before 1000 cycles and lacked reliability after the mounting.

(Example 7)

Sintered products having a size of 5×4×40 mm were obtained by using a variety of ceramic materials shown in Table 10, and were then measured for their Young's moduli and coefficients of thermal expansion at 40 to 400° C. The results were as shown in Table 10.

On boards of ceramic materials shown in Table 10 were formed metallized wiring layers of copper, and in which were further formed through-holes. A number of connection pads of copper were formed on the surfaces of the boards at places connected to the through-holes thereby to prepare wiring boards for packages.

The wiring boards all possessed a thickness of 0.4 mm.

On the other hand, there was formed a silicon semiconductor element having a coefficient of thermal expansion of 2.6 ppm/°C. at 40 to 400° C. and equipped with solder bumps on the lower surface thereof.

The solder bumps of the semiconductor element were so positioned as will be connected to the connection pads of the wiring board for package, and were heat-treated in a nitrogen atmosphere at 350° C. for three minutes, so that the solder bumps of the semiconductor elements were melted and connected to the connection pads of the wiring board.

Then, a filler of a mixture of a thermosetting resin and a quartz glass or alumina as shown in Table 11 was poured into between the semiconductor element and the wiring board, and was cured at 180° C. for two hours in the open air.

As will be obvious from Table 11, the materials in which the filler exhibited a coefficient of thermal expansion of 20 to 50 ppm/°C. and a Young's modulus of from 5 to 10 GPa, i.e., the samples Nos. 4, 5, 9, 10, 16, 17, 21 and 22, exhibited no change in the electric resistance between the semiconductor element and the wiring board, and maintained very stable and favorable electric connection.

It was learned that other samples Nos. 1, 2, 3, 6, 7, 8, 11, 12, 13, 14, 15, 18, 19, 20, 23 and 24 (samples other than those of the present invention) exhibited a change in the resistance before 1000 cycles and lacked reliability in the electric connection.

TABLE 10

| | Insulating board material | | | Young's modulus (GPa) | Coefficient of thermal expansion (ppm/° C.) |
|---|---|---|---|---|---|
| | Glass | (% by vol.) | Filler | (% by vol.) | | |
| A | $SiO_2(78)$—$Li_2O(10)$—$Al_2O_3(4)$—$K_2O(4)$—$P_2O_5(2)$—$Na_2O(2)$ | 50 | forsterite | 50 | 108 | 11.7 |
| B | $SiO_2(78)$—$Li_2O(10)$—$Al_2O_3(4)$—$K_2O(4)$—$P_2O_5(2)$—$Na_2O(2)$ | 35 | forsterite quarts | 30 35 | 114 | 14.6 |
| C | $ZnO(38)$—$Al_2O_3(15)$—$SiO_2(45)$ $B_2O_3(2)$ | 50 | quarts | 50 | 105 | 17.3 |

A structure in which the semiconductor element was mounted on the wiring board as described above was subjected to the heat cycle testing in the same manner as in Example 1 to measure the electric resistance between the semiconductor element and the wiring board. The number of cycles were counted until a change in the electric resistance has appeared. The results were as shown in Table 11.

We claim:

1. A structure for mounting a wiring board in which the wiring board includes a ceramic insulating board, metallized wiring layers arranged on said insulating board, and a plurality of connection terminals mounted on said insulating board and electrically connected to said metallized wiring layer, the wiring board placed on a mother board having

TABLE 11

| Sample No. | Insulating board material | resin | Filler composition Filler (pts by wt.) Quarts glass | Alumina | Coefficient of thermal expansion (ppm/° C.) | Young's modulus Gpa | Heat cycle testing (times) |
|---|---|---|---|---|---|---|---|
| 1 | A | (1) | 25 | 0 | 75 | 2.8 | 350 |
| 2 | A | (1) | 50 | 0 | 66 | 3.2 | 500 |
| 3 | A | (1) | 100 | 0 | 43 | 4.7 | 800 |
| 4 | A | (1) | 150 | 0 | 35 | 6.6 | >1000 |
| 5 | A | (1) | 200 | 0 | 22 | 9.6 | >1000 |
| 6 | A | (1) | 250 | 0 | 12 | 11.2 | 900 |
| 7 | B | (2) | 25 | 0 | 55 | 3.4 | 650 |
| 8 | B | (2) | 50 | 0 | 41 | 4.8 | 850 |
| 9 | B | (2) | 100 | 0 | 33 | 5.2 | >1000 |
| 10 | B | (2) | 150 | 0 | 26 | 7.5 | >1000 |
| 11 | B | (2) | 200 | 0 | 16 | 9.8 | 900 |
| 12 | B | (2) | 250 | 0 | 8 | 13.5 | 850 |
| 13 | C | (1) | 0 | 25 | 80 | 3.4 | 350 |
| 14 | C | (1) | 0 | 50 | 71 | 3.8 | 400 |
| 15 | C | (1) | 0 | 100 | 61 | 5.1 | 700 |
| 16 | C | (1) | 0 | 150 | 43 | 6.6 | >1000 |
| 17 | C | (1) | 0 | 200 | 32 | 8.9 | >1000 |
| 18 | C | (1) | 0 | 250 | 21 | 12.2 | 850 |
| 19 | A | (2) | 0 | 25 | 50 | 4.2 | 650 |
| 20 | A | (2) | 0 | 50 | 52 | 5.5 | 800 |
| 21 | A | (2) | 0 | 100 | 44 | 7.1 | >1000 |
| 22 | A | (2) | 0 | 150 | 37 | 9.3 | >1000 |
| 23 | A | (2) | 0 | 200 | 20 | 12.5 | 900 |
| 24 | A | (2) | 0 | 250 | 15 | 14.2 | 800 |

Note:
(1) phenol novolak epoxy
(2) cresol novolok epoxy wiring conductors formed on the surface of an insulator which contains an organic resin, and the connection terminals of said wiring board are connected by brazing to the wiring conductors of said mother board, wherein parameters L, $\Delta\alpha$ and H that define a thermal stress value F1 between the wiring board and the mother board are chosen so that F1 which is defined by the following formula (1):

$$F1 = L \times \Delta\alpha / H^2 \qquad (1)$$

wherein

L is a distance (mm) between the two connection terminals which are most separated away from each other among a plurality of connection terminals mounted on said insulating board, $\Delta\alpha$ is a difference in the coefficient of thermal expansion (ppm/°C.) between the insulating board of said wiring board and said mother board at 40 to 400° C., and H is a height (mm) of brazing between said wiring board and said mother board, is not larger than 2000.

2. A structure for mounting a wiring board according to claim 1, wherein the distance L is not smaller than 6 mm.

3. A structure for mounting a wiring board according to claim 1, wherein said insulating board has a coefficient of thermal expansion of from 8 to 25 ppm/°C. at 40 to 400° C.

4. A structure for mounting a wiring board according to claim 3, wherein said insulating board is composed of a sintered product of glass ceramics.

5. A structure for mounting a wiring board according to claim 4, wherein said insulating board is obtained by molding and firing a mixture which comprises 20 to 80% by volume of a lithium silicate glass containing 5 to 30% by weight of $Li_2O$ and 80 to 20% by volume of at least one selected from the group consisting of forsterite, cristobalite and quartz.

6. A structure for mounting a wiring board according to claim 1, wherein said mother board has a coefficient of thermal expansion of from 8 to 28 ppm/°C. at 40 to 400° C.

7. A structure for mounting a wiring board according to claim 1, wherein a semiconductor element having electrodes for connection is placed on the surface of the insulating board of said wiring board, said electrodes for connection are secured to said metallized wiring layer by brazing, a filler containing a thermosetting resin is poured into between said wiring board and said semiconductor element and is cured, said insulating board has a coefficient of thermal expansion of from 8 to 25 ppm/°C. at 40 to 400° C., and the filler that is cured has a coefficient of thermal expansion of from 20 to 50 ppm/°C. at 40 to 400° C. and a Young's modulus of from 5 to 10 GPa over the same temperature range.

8. A structure for mounting a wiring board according to claim 7, wherein said thermosetting resin is a phenol novolak epoxy resin or a cresol novolak epoxy resin.

9. A structure for mounting a wiring board in which the wiring board includes a ceramic insulating board, metallized wiring layers arranged on said insulating board, and a plurality of connection terminals mounted on said insulating board and electrically connected to said metallized wiring layer, the wiring board placed on a mother board having wiring conductors formed on the surface of an insulator which contains an organic resin, and the connection terminals of said wiring board are connected by brazing to the wiring conductors of said mother board, wherein parameters L, $\Delta\alpha$, t and E that define a thermal stress value F2 between the wiring board and the mother board are chosen so that F2 which is defined by the following formula (2):

$$F2 = L \times \Delta\alpha \times t - [(0.025 \times L^3 \times \Delta\alpha)/(E \times t^3)] \qquad (2)$$

wherein

L is a distance (mm) between the two connection terminals which are most separated away from each other among a plurality of connection terminals mounted on said insulating board, $\Delta\alpha$ is a difference in the coefficient of thermal expansion (ppm/°C.) between the insulating board of said wiring board and said mother board at 40 to 400° C., t is a thickness (mm) of the wiring board, and E is a Young's modulus (GPa) of the wiring board, is not larger than 200.

10. A structure for mounting a wiring board according to claim 9, wherein the thickness t is not smaller than 0.3 mm, and the distance L is not smaller than 20 mm.

11. A structure for mounting a wiring board according to claim 9, wherein said insulating board has a coefficient of thermal expansion of from 8 to 25 ppm/°C. at 40 to 400° C.

12. A structure for mounting a wiring board according to claim 11, wherein said insulating board is composed of a sintered product of glass ceramics.

13. A structure for mounting a wiring board according to claim 12, wherein said insulating board is obtained by molding and firing a mixture which comprises 20 to 80% by volume of a lithium silicate glass containing 5 to 30% by weight of $Li_2O$ and 80 to 20% by volume of at least one selected from the group consisting of forsterite, cristobalite and quartz.

14. A structure for mounting a wiring board according to claim 9, wherein a semiconductor element having electrodes for connection is placed on the surface of the insulating board of said wiring board, said electrodes for connection are secured to said metallized wiring layer by brazing, a filler containing a thermosetting resin is poured into between said wiring board and said semiconductor element and is cured, said insulating board has a coefficient of thermal expansion of from 8 to 25 ppm/°C. at 40 to 400° C., and the filler that is cured has a coefficient of thermal expansion of from 20 to 50 ppm/°C. at 40 to 400° C. and a Young's modulus of from 5 to 10 GPa over the same temperature range.

15. A structure for mounting a wiring board according to claim 9, wherein said thermosetting resin is a phenol novolak epoxy resin or a cresol novolak epoxy resin.

* * * * *